(12) United States Patent
Zou

(10) Patent No.: US 11,852,976 B2
(45) Date of Patent: Dec. 26, 2023

(54) EXPOSURE MACHINE AND EXPOSURE METHOD

(71) Applicant: CHANGXIN MEMORY TECHNOLOGIES, INC., Hefei (CN)

(72) Inventor: Bin Zou, Anhui (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 167 days.

(21) Appl. No.: 17/437,752

(22) PCT Filed: Mar. 10, 2021

(86) PCT No.: PCT/CN2021/080070
§ 371 (c)(1),
(2) Date: Sep. 9, 2021

(87) PCT Pub. No.: WO2021/180140
PCT Pub. Date: Sep. 16, 2021

(65) Prior Publication Data
US 2023/0176483 A1  Jun. 8, 2023

(30) Foreign Application Priority Data

Mar. 13, 2020  (CN) .......................... 202010176633.3

(51) Int. Cl.
*G03F 7/20* (2006.01)
*G03F 1/82* (2012.01)
*G03F 7/00* (2006.01)

(52) U.S. Cl.
CPC .............. *G03F 7/2063* (2013.01); *G03F 1/82* (2013.01); *G03F 7/7085* (2013.01); *G03F 7/70925* (2013.01)

(58) Field of Classification Search
CPC .. G03F 7/7085; G03F 7/70925; G03F 7/2063; G03F 7/20; G03F 7/70283;
(Continued)

(56) References Cited

U.S. PATENT DOCUMENTS

2002/0176060 A1* 11/2002 Park ..................... G03F 7/70983
355/53
2007/0146658 A1* 6/2007 Van Mierlo ............ G01N 21/94
355/53
(Continued)

FOREIGN PATENT DOCUMENTS

CN  102426412 A  * 4/2012
CN  202649668 U  * 1/2013
(Continued)

OTHER PUBLICATIONS

English translation of JP2000-098589, published Apr. 7, 2000. (Year: 2000).*
(Continued)

*Primary Examiner* — Christina A Riddle
(74) *Attorney, Agent, or Firm* — Ladas & Parry LLP

(57) ABSTRACT

An exposure machine and an exposure method are provided in some embodiments of the present disclosure. The exposure machine includes: a detection module, configured to detect whether there are attachments on the surface of a reticle; a cleaning device, configured to clean the attachments on the surface of the reticle; and an exposure module, configured to expose the reticle having no attachments detected.

5 Claims, 4 Drawing Sheets

(58) Field of Classification Search
CPC .. G03F 7/70591; G03F 7/708; G03F 7/70808; G03F 7/70858–70941; G03F 7/70975; G03F 7/70983; G03F 7/70991; G03F 1/82; G03F 1/84; G03F 1/66; G03F 1/68
USPC .............. 355/18, 30, 52–55, 67–77; 430/5
See application file for complete search history.

(56) References Cited

U.S. PATENT DOCUMENTS

| | | | |
|---|---|---|---|
| 2010/0183987 A1* | 7/2010 | Yonekawa | G03F 7/70866 355/30 |
| 2011/0279799 A1* | 11/2011 | Singer | G03F 7/70925 355/53 |
| 2018/0161825 A1* | 6/2018 | Son | C23C 14/042 |

FOREIGN PATENT DOCUMENTS

| | | | | |
|---|---|---|---|---|
| CN | 202649668 | U | | 1/2013 |
| CN | 203811982 | U | | 9/2014 |
| CN | 104438226 | A | * | 3/2015 |
| CN | 204667040 | U | | 9/2015 |
| CN | 108267936 | A | | 7/2018 |
| CN | 109240045 | A | | 1/2019 |
| CN | 208673040 | U | | 3/2019 |
| CN | 110737175 | A | | 1/2020 |
| CN | 210835584 | U | | 6/2020 |
| DE | 102005032320 | A1 | | 1/2007 |
| JP | H1140478 | A | | 2/1999 |
| JP | H11135409 | A | | 5/1999 |
| JP | 2000098589 | A | * | 4/2000 |
| KR | 2009044540 | A | * | 5/2009 |

OTHER PUBLICATIONS

English translation of KR2009044540, published May 7, 2009. (Year: 2009).*
English translation of CN102426412, published Apr. 25, 2012. (Year: 2012).*
English translation of CN202649668, published Jan. 2, 2013. (Year: 2013).*
English translation of CN104438226, published Mar. 25, 2015. (Year: 2015).*
First Chinese office action with a English translation dated Feb. 11, 2022 for Application No. CN 202010176633.3.
Espacenet English abstract of DE 102005032320 A1.
Espacenet English abstracr of CN 110737175 A.
espacenet English abstract of CN 109240045 A.
International Search Report and Written Opinion dated Jun. 1, 2021 for Application No. PCT/CN2021/080070.

* cited by examiner

EXPOSURE MACHINE AND EXPOSURE METHOD

CROSS-REFERENCE TO RELATED APPLICATIONS

The present disclosure is an application under 35 U.S.C. 371 of International Application No. PCT/CN2021/080070, filed on Mar. 10, 2021, which claims priority to Chinese Patent Application No. 2020101766333, titled "Exposure machine and exposure method", filed on Mar. 13, 2020, each of which is incorporated herein by reference in its entirety.

TECHNICAL FIELD

The present disclosure relates to the field of semiconductors, and in particular to an exposure machine and an exposure method.

BACKGROUND

In the photolithography process, an exposure machine generally comprises a light source and a reticle. The reticle is a transparent slab whose surface is covered by various patterns. Each pattern contains opaque and transparent parts to block and allow light to pass through. The light source can project the patterns onto the photoresist-coated wafer through the reticle, thereby removing the photoresist in the transparent part and leaving the photoresist in the opaque part to generate a three-dimensional relief pattern to assist in etching a circuit pattern on the wafer.

In practice, in order to ensure the integrity and accuracy of the photolithography image, before using the reticle for photolithography, it is usually necessary to detect the surface of the reticle to determine whether there are attachments. Therefore, the exposure machine in the prior art is usually provided with a detection module to avoid the influence of the attachments on the surface of the reticle, such as dust and particles, on the accuracy and integrity of the photolithography.

However, for the exposure machine in the prior art, when attachments are detected on the surface of the reticle, it is necessary to unload the reticle from the exposure machine, clean it in a special cleaning device and then load it into the exposure machine again. As a result, the operating efficiency of the exposure machine is low. Meanwhile, the cleaning effect of the reticle in the existing method needs to be optimized.

SUMMARY

The purpose of some embodiments of the present disclosure is to provide an exposure machine and an exposure method to improve the operating efficiency of the exposure machine and optimize the cleaning effect of the reticle.

In order to solve the technical problems, some embodiments of the present disclosure provide an exposure machine, comprising: a detection module, configured to detect whether there are attachments on the surface of a reticle; a cleaning device, configured to clean the attachments on the surface of the reticle; and an exposure module, configured to expose the reticle having no attachments detected.

Some embodiments of the present disclosure further provide an exposure method, executed by the exposure machine described above, comprising: moving a reticle to a detection module; detecting the reticle to determine whether there are attachments on the surface of the reticle; moving the reticle to an exposure module for exposure, when there is no attachments on the surface of the reticle; and cleaning the reticle by the cleaning device and detecting the surface of the reticle again, when there is an attachments on the surface of the reticle.

BRIEF DESCRIPTION OF THE DRAWINGS

One or more embodiments will be exemplified by pictures in the corresponding drawings. These exemplified descriptions do not constitute any limitation to the embodiments. Elements with the same reference numerals in the drawings are represented as similar. Unless otherwise stated, the drawings are not necessarily drawn to scale.

DETAILED DESCRIPTION

To make the objectives, technical solutions and advantages of the present disclosure clearer, some implementations of the present disclosure will be described below in detail with reference to the accompanying drawings. However, it may be understood by a person of ordinary skill in the art that, in some embodiments of the present disclosure, many technical details are provided for the better understanding of the present disclosure. However, the technical solutions sought to be protected by the present disclosure can be implemented, even without these technical details and various changes and modifications based on the following some embodiments.

Figure 1:
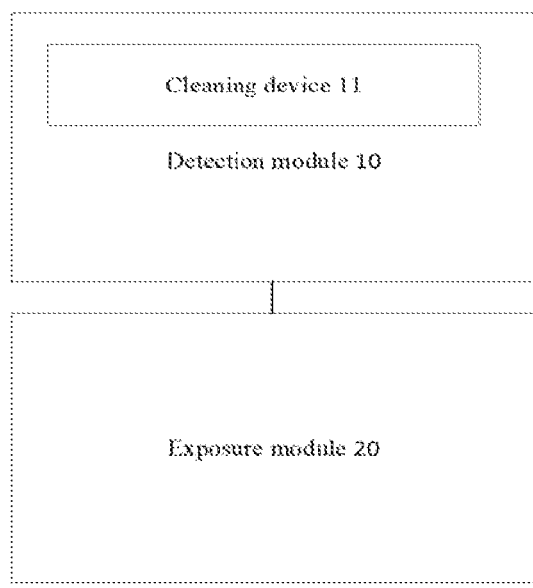
FIG. 1 is a schematic structure diagram of an exposure machine according to an embodiment of the present disclosure.

An embodiment of the present disclosure relates to an exposure machine. The specific structure is shown in FIG. 1. The exposure machine comprises: a detection module 10, a cleaning device 11, and an exposure module 20. The detection module 10 is configured to detect whether there are attachments on the surface of a reticle. The cleaning device 11 is configured to clean the attachments on the surface of the reticle. The exposure module 20 is configured to expose the reticle having no attachments detected. Optionally, in this embodiment, the cleaning device 11 is arranged in the detection module 10. It may be understood that the arrangement of the cleaning device 11 in the detection module 10 is just an example of a specific position where the cleaning device 11 is arranged in the exposure machine in this embodiment, and does not constitute any limitation. In other embodiments of the present disclosure, the cleaning device 11 may be arranged in other positions in the exposure machine, and may be arranged flexibly according to actual needs.

Figure 2:
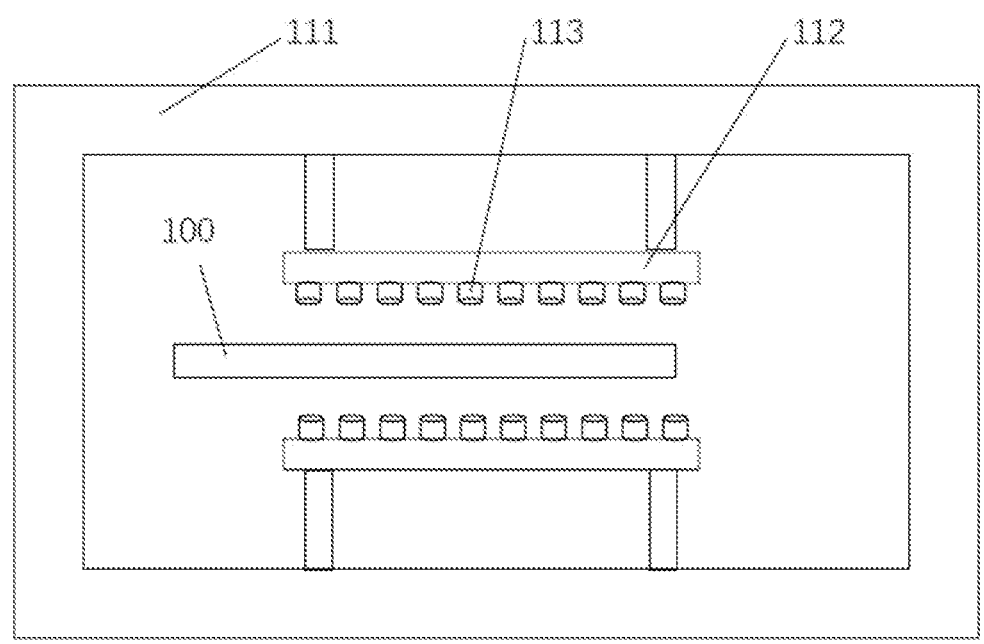
FIG. 2 is a schematic structure diagram of a reticle and a cleaning device in an exposure machine according to an embodiment of the present disclosure.

In the exposure machine according to some embodiments of the present disclosure, a cleaning device 11 is integrated in the exposure machine. When the detection module 10 detects that there are attachments on the surface of the reticle, the cleaning device 11 can directly clean the surface of the reticle without unloading the reticle from the exposure machine, thereby eliminating the repeated loading and unloading processes, effectively simplifying the exposure process, and improving the operating efficiency of the exposure machine. In one of the embodiments, the elimination of the repeated loading and unloading of the reticle avoids the damage to the reticle during the repeated loading and unloading processes and improves the reliability of the exposure machine. In some embodiments, FIG. 2 is a schematic structure diagram of the cleaning device 11 when cleaning the reticle 100. It may be understood that the reticle 100 is drawn in FIG. 2 only for ease of understanding in this embodiment, and is not part of the cleaning device 11. The cleaning device 11 comprises a housing 111 and a support frame 112 provided on the housing 111, and the support frame 112 is provided with gas sprayers 113 configured to clean the reticle 100. The gas sprayers 113 are configured to spray gas to the reticle 100 to clean the reticle 100. By setting the gas sprayers 113 to spray gas to the reticle, the cost of raw materials is reduced. In one of the embodiments, the gas spraying process has less influence on other parts of the exposure machine, thereby effectively ensuring the normal operation of the exposure machine.

Figure 3:
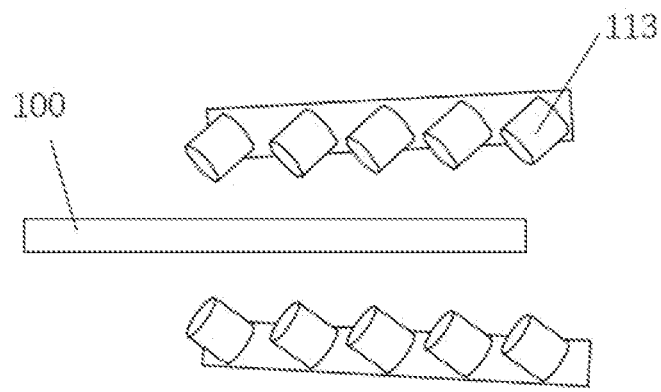
FIG. 3 is a schematic structure diagram of a reticle and gas sprayers in an exposure machine according to an embodiment of the present disclosure.

In some embodiments, as shown in FIG. 3, during the cleaning device 11 cleans the reticle 10, an angle between the gas spraying direction of the gas sprayers 113 and the reticle 100 is greater than 5° and less than 85°. Setting the angle between the gas spraying direction of the gas sprayers 113 and the reticle 100 to be greater than 5° and less than 85° can improve the purging efficiency and can blow off the attachments more effectively. The cleaning efficiency and cleaning effect of the cleaning device 11 are effectively improved. It may be understood that the angle between the gas spraying direction of the gas sprayers 113 and the reticle 100 being greater than 5° and less than 85° is just a preferred example in this embodiment and does not constitute any limitation. In other embodiments of the present disclosure, the angle may be greater than 85° or less than 5°, which will not be listed here and may be set flexibly according to actual needs.

In some embodiments, the angle between the gas spraying direction of the gas sprayers 113 and the reticle 100 is 45°. It may be understood that, when the angle between the gas spraying direction of the gas sprayers 113 and the reticle 100 is 45°, better cleaning effect may be achieved. However, this does not constitute any limitation.

Further, in this embodiment, there are multiple gas sprayers 113, and the multiple gas sprayers 113 are oppositely arranged on the support frame 112; and the multiple gas sprayers 113 blow gas to two opposite surfaces of the reticle 100, respectively, during the cleaning device 11 cleans the reticle 100. By providing multiple gas sprayers 113 and arranging the multiple gas sprayers 113 to respectively blow gas to two opposite surfaces of the reticle 100, the surface of the reticle 100 can be cleaned more comprehensively, and the cleaning speed may be effectively increased. Further, the reliability and the operating efficiency of the exposure machine are improved.

In some embodiments, the distance between the gas sprayers 113 ranges from 0.5 mm to 10 mm; and the gas sprayers 113 are cylindrical, the diameters of the bottom surface of the cylindrical gas sprayers 113 range from 0.5 mm to 15 mm, and the lengths of the cylindrical gas sprayers 113 range from 0.5 mm to 20 mm. With such an arrangement of the gas sprayers 113, the space occupied by the gas sprayers 113 is saved on the premise of ensuring the purging effect.

In some embodiments, the gas blown from the gas sprayers 113 is clean air or nitrogen. The use of clean air or nitrogen which is more stable in nature will not cause damage to the exposure machine and reticle. In one of the embodiments, the cost of clean air and nitrogen is lower, thereby effectively solving the cost.

Figure 4:
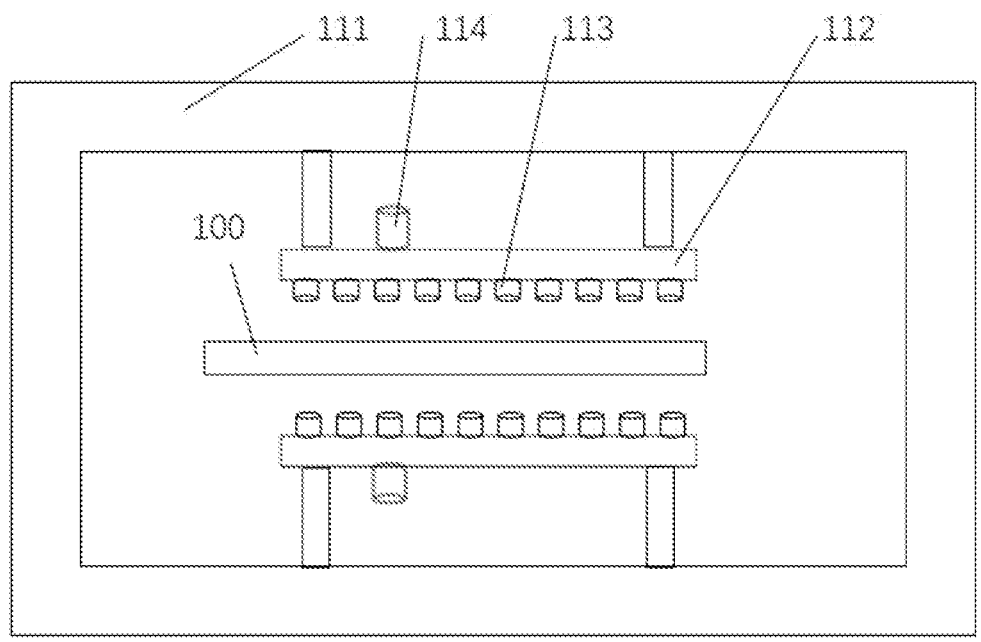
FIG. 4 is a schematic structure diagram of a reticle and a cleaning device in an exposure machine according to another embodiment of the present disclosure.

Another embodiment of the present disclosure relates to an exposure machine. In this embodiment, as shown in FIG. 4, the cleaning device 11 further comprises a gas flow control device 114, and the gas flow control device 114 is configured to control the flow rate of the gas flow sprayed by the gas sprayers 113.

In the exposure machine according to another embodiment of the present disclosure, the cleaning device 11 is further provided with a gas flow control device 114 connected to the gas sprayers 113. Controlling the flow rate of the gas flow sprayed by the gas sprayers 113 by the gas flow control device 114 avoids the damage to the reticle due to the excessive gas flow or the ineffective cleaning of the reticle due to the insufficient gas flow. Further, the reliability and operating efficiency of the exposure machine are improved.

Figure 5:
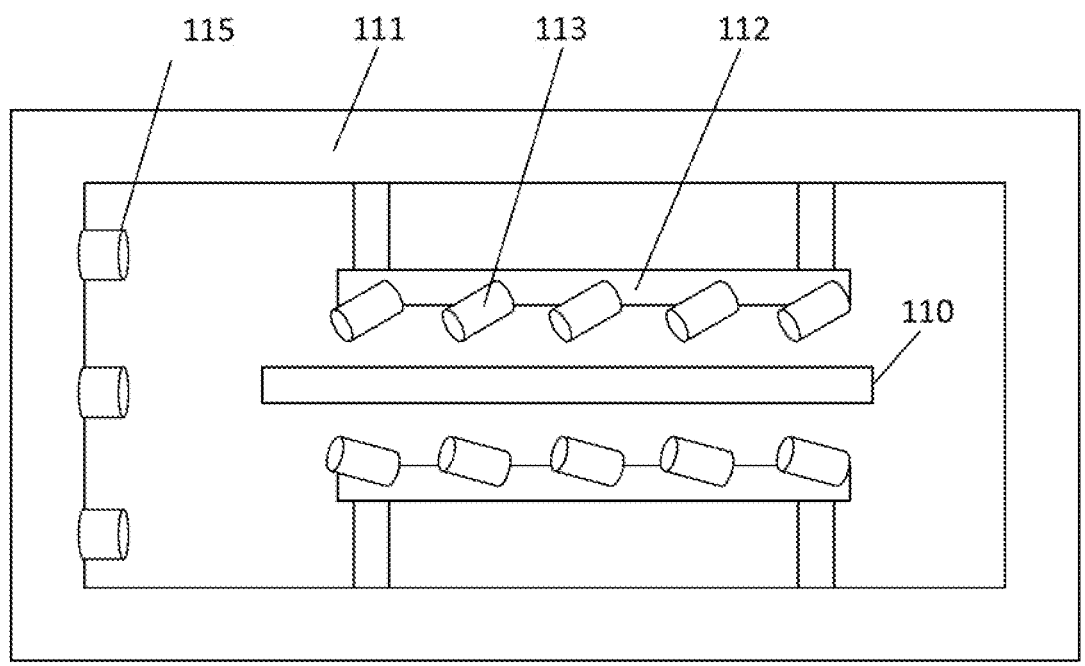
FIG. 5 is a schematic structure diagram of a reticle and a cleaning device in an exposure machine according to still another embodiment of the present disclosure.

Still another embodiment of the present disclosure relates to an exposure machine. In this embodiment, as shown in FIG. 5, angles between the gas spraying directions of the gas sprayers 113 and the reticle 110 are the same and are between 15° and 25°; and gas vents 115 are formed on the side surface of the housing 111 in the gas spraying direction. In some embodiments, multiple gas vents 115 may be formed on the side surface of the housing opposite to the gas sprayers 113. The distribution of the gas vents may be adjusted according to the angle between the gas spraying direction of the gas sprayers 113 and the reticle, so that the gas sprayed by the gas sprayers 113 bounces off the reticle 110 and is exactly aligned with the gas vents 115. In some embodiments, the angle is 20°, and the distance between the gas vents 115 is 50 mm.

The exposure machine according to still another embodiment of the present disclosure retains the technical effects of some of the foregoing embodiments and also has the following advantages: by purging the reticle with gas sprayers in the same direction at a small angle and correspondingly forming gas vents on the side surface of the housing in the gas spraying direction, the attachments can be blown away more easily and the purging gas flow can be exhausted more economically. In this way, the gas pressure inside and outside the exposure machine is balanced, the damage to the exposure machine due to excessive gas pressure is avoided, and the safety of the exposure machine is improved.

In some embodiments, the gas flow sprayed by the gas sprayers 113 is a pulsed gas flow, the gas vents 115 pump gas in the cleaning device 11 by pulsed pumping, and the pulses of the gas flow are synchronized with or have a fixed time interval with the pulses of pulsed pumping. By pulsed pumping, the ability to blow the attachment away can be enhanced. Meanwhile, the use of pulsed pumping coordinated with the pulsed gas flow can well maintain the gas flow state inside and outside the housing 111 and ensure the environmental stability inside the photolithography machine.

Figure 6:
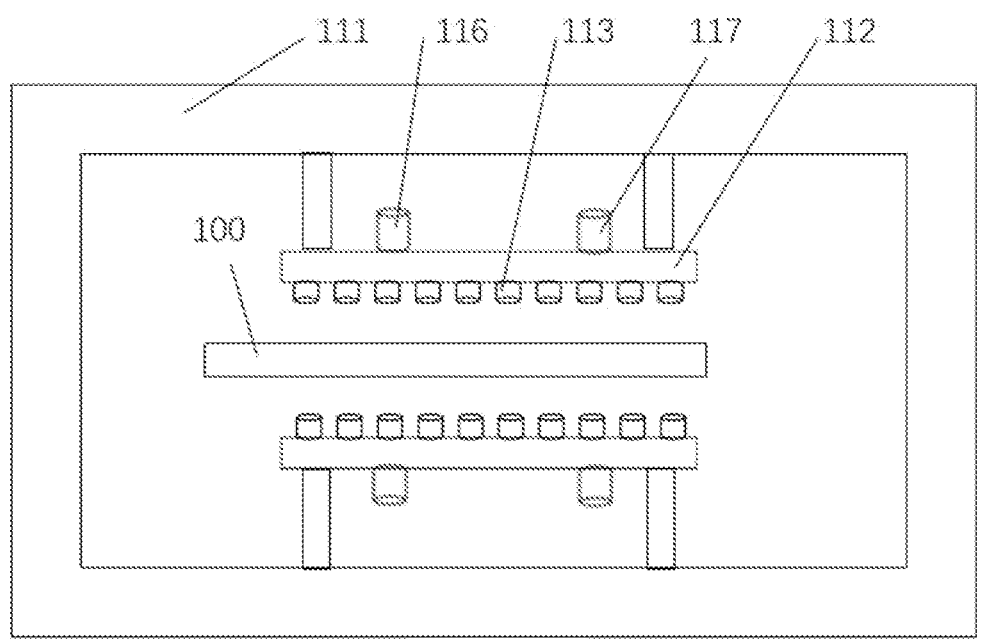
FIG. 6 is a schematic structure diagram of a reticle and a cleaning device in an exposure machine according to yet another embodiment of the present disclosure.

Yet another embodiment of the present disclosure relates to an exposure machine. In this embodiment, as shown in FIG. 6, the cleaning device 11 further comprises an electrical detection component 116 and a gas adjustment component 117, wherein the gas adjustment component 117 is connected to the gas sprayers 113; the electrical detection component 116 is configured to detect the electrical property of the attachments; and the gas adjustment module 117 is configured to adjust the electrical property of gas sprayed by the gas sprayers 113 to be opposite to the electrical property of the attachments.

For example, in this embodiment, when the electrical detection component 116 detects that the electrical property of the attachments is positive charge, the gas adjustment module 117 adds a certain amount of negatively charged particles to the gas sprayed by the gas sprayers 113. The negatively charged particles neutralize the electrical property of the attachments, so that the attachments are electrically neutral and it is easier to blow away the attachments.

The exposure machine according to yet another embodiment of the present disclosure retains the technical effects of the foregoing embodiments and also has the following advantages: by providing the electrical detection component 116 to detect the electrical property of the attachments and providing the gas adjustment module 117 to adjust the electrical property of the gas sprayed by the gas sprayers 113 to be opposite to that of the attachments, the electrical property of the charged attachments is effectively neutralized, so that it is easier to blow away the attachments. The operating efficiency of the exposure machine is further improved.

Figure 7:
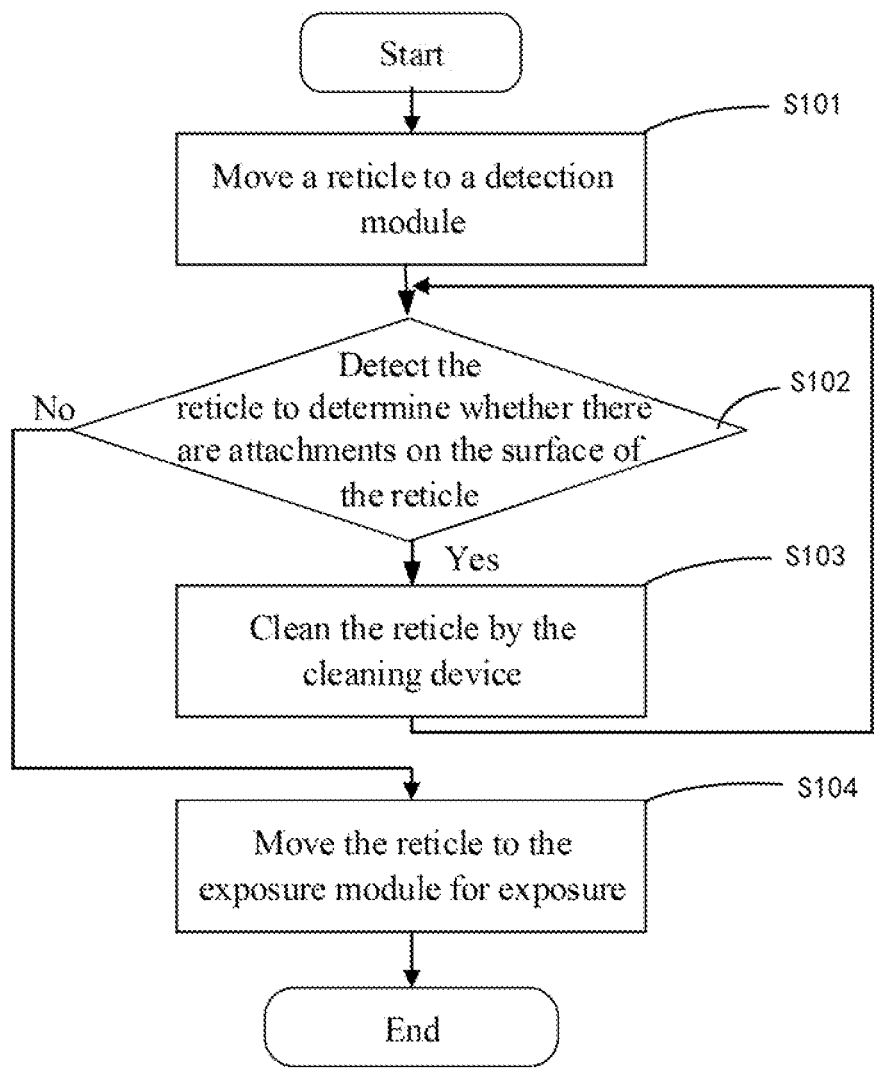
FIG. 7 is a schematic view of an exposure method according to another embodiment of the present disclosure.

Another embodiment of the present disclosure relates to an exposure method, executed by the exposure machine according to some of the foregoing embodiments. The specific steps are shown in FIG. 7.

S101: A reticle is moved to a detection module.

S102: The reticle is detected to determine whether there are attachments on the surface of the reticle. If so, S103 is executed; and if not, S104 is executed.

S103: The reticle is cleaned by the cleaning device.

S104: The reticle is moved to the exposure module for exposure.

It is not really surprising to discover that this embodiment is a method embodiment corresponding to some of the foregoing embodiments of the device, and this embodiment may be implemented together with the those embodiments. Related technical details mentioned in those embodiments are applicable to this embodiment with the same technical effects, and will not be repeated for simplicity. Correspondingly, related technical details mentioned in this embodiment are applicable to those embodiments.

The division of the steps of the various methods above is just for clarity of description. When implemented, the steps may be combined into one step or some steps may be split and decomposed into multiple steps, as long as they include the same logical relationship, without departing from the scope of the present disclosure. Adding insignificant modifications to the algorithm or process or introducing insignificant designs without changing the key design of the algorithm or process are within the protection scope of the present disclosure.

It is to be noted that the modules involved in some embodiments of the present disclosure are logical modules. In practical applications, a logical unit may be a physical unit, or part of a physical unit, or a combination of multiple physical units. In one of the embodiments, in order to highlight the innovativeness of the present disclosure, in some embodiments, units that are not closely related to solving the technical problem proposed by the present disclosure are not introduced. However, this does not indicate the absence of other units in some embodiments.

It may be understood by a person of ordinary skill in the art that those embodiments are specific embodiments for realizing the present disclosure, and in actual applications, various changes may be made to the form and details without departing from the spirit and scope of the present disclosure.

The invention claimed is:

1. An exposure machine, comprising:
   a detection module, configured to detect whether there are attachments on a surface of a reticle;
   a cleaning device, configured to clean the attachments on the surface of the reticle, and the cleaning device being arranged in the detection module; and
   an exposure module, configured to expose the reticle having no attachments detected; wherein
   the cleaning device comprises a housing and a support frame provided on the housing, the support frame is provided with multiple gas sprayers configured to spray gas to the reticle to clean the reticle;
   the multiple gas sprayers are oppositely arranged on the support frame, and configured to blow gas to two opposite surfaces of the reticle, respectively, while the cleaning device cleans the reticle;
   angles between the gas spraying directions of the gas sprayers and the reticle are the same and are between 15° and 25°;
   gas vents are formed on the side surface of the housing in the gas spraying directions;
   the gas flow sprayed by the gas sprayers is pulsed gas flow, the gas vents pump gas in the cleaning device by pulsed pumping, and the pulses of the gas flow are synchronized with or have a fixed time interval with the pulses of pulsed pumping;
   the cleaning device further comprises an electrical detection component and a gas adjustment component;
   the electrical detection component is configured to detect the electrical property of the attachments; and
   the gas adjustment component is configured to adjust the electrical property of gas sprayed by the gas sprayers to be opposite to the electrical property of the attachments.

2. The exposure machine according to claim 1, wherein the cleaning device further comprises a gas flow control device connected to the gas sprayers, and the gas flow control device is configured to control the flow rate of the gas flow sprayed by the gas sprayers.

3. The exposure machine according to claim 1, wherein the distance between the gas sprayers ranges from 0.5 mm to 10 mm; and the gas sprayers are cylindrical, the diameters of the bottom surface of the cylindrical gas sprayers range from 0.5 mm to 15 mm, and the lengths of the cylindrical gas sprayers range from 0.5 mm to 20 mm.

4. The exposure machine according to claim 1, wherein the gas is clean air or nitrogen.

5. An exposure method, executed by the exposure machine according to claim 1, comprising:
   moving a reticle to a detection module;
   detecting the reticle to determine whether there are attachments on the surface of the reticle;

moving the reticle to an exposure module for exposure, when there is no attachments on the surface of the reticle; and cleaning the reticle by the cleaning device and detecting the surface of the reticle again, when there are attachments on the surface of the reticle.

\* \* \* \* \*